SEMICONDUCTOR AMPLIFIER USING FIELD EFFECT MODULATION OF TUNNELING

Filed Aug. 10, 1966

INVENTORS C. N. BERGLUND
D. KAHNG
BY H. W. Lockhart
ATTORNEY

United States Patent Office 3,462,700

Patented Aug. 19, 1969

3,462,700

SEMICONDUCTOR AMPLIFIER USING FIELD EFFECT MODULATION OF TUNNELING

Carl N. Berglund, North Plainfield, and Dawon Kahng, Bridgewater Township, Somerset County, N.J., assignors to Bell Telephone Laboratories, Incorporated, Murray Hill, N.J., a corporation of New York Filed Aug. 10, 1966, Ser. No. 571,636
Int. Cl. H03f *3/16;* H01l *3/12*
U.S. Cl. 330—35 7 Claims

ABSTRACT OF THE DISCLOSURE

A solid state amplifier comprises an MOS structure in which the semiconductor body has a surface layer adjoining the dielectric oxide film of extreme thinness, about a carrier diffusion length, and has a very high impurity concentration. The remainder of the body is of opposite conductivity type and of moderate impurity concentration defining with the surface layer a PN junction which, in operation, is biased to collect minority carriers injected by application of a sufficiently large D.C. voltage between the field electrode and the thin surface layer to enable quantum-mechanical tunneling. The D.C. field voltage may be modulated by a suitable superimposed signal voltage.

Figure 1:
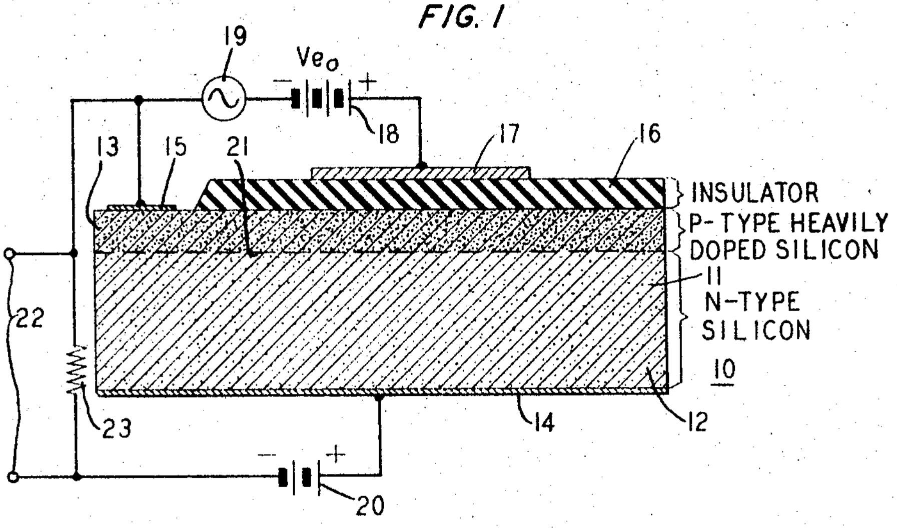

This invention relates to semiconductor devices and more particularly to a novel type of solid state amplifier.

In the patent application of coapplicant Berglund, filed concurrently with this application and assigned to the same assignee, a novel mode of minority carrier injection is disclosed. In that disclosure it is suggested that minority carriers for injection are furnished in the space-charge region by avalanching and tunneling, but that, for certain applications, the tunneling mechanism is disadvantageous. This invention, however, is based on the recognition that the tunneling mode for producing minority carrier injection conveniently may be modulated by the same field effect structure provided for the injection process to produce a uniquely advantageous solid state amplifier.

In a particular embodiment in accordance with this invention a dielectric film is disposed between a metal electrode and a semiconductor body. The portion of the semiconductor body adjoining the dielectric film comprises a very thin zone of one conductivity type which contains a very high concentration of significant impurity atoms. In particular, the impurity doping in this zone is at the level termed degenerate, to enable quantum-mechanical tunneling of electrons between the conduction band upon application of a high electric field by way of the valence band and metal electrode on the dielectric film. This highly doped zone is very thin, comparable to or even much less than one minority carrier diffusion length.

The remainder of the semiconductor body comprises a thicker substrate portion of opposite conductivity type having a moderate impurity concentration. The PN junction thus defined between the thin zone of one conductivity type and the substrate portion of opposite conductivity type is biased in reverse to function as a collector junction for the minority carriers provided in the thin zone. This collection process is dependent in part upon the thin zone having a dimension comparable to the carrier diffusion length as well as upon the applied field.

Thus a high direct current potential applied to the dielectric layer induces the tunneling process within the thin zone near the dielectric semiconductor interface whereby minority carriers are provided for injection into the thin zone to poduce a current for collection by the reverse-biased PN junction. This current is modulated by a small alternating current signal likewise imposed across the dielectric film to affect the density of minority carriers made available by tunneling and consequently the carriers injected and thereafter collected. Finally, an amplified replica of the modulated current appears across the high impedance collector junction.

A primary advantage of the device in accordance with this invention resides in the fact that its input impedance is almost purely capacitive in contrast to the conventional two-junction bipolar transistor which has a largely conductive input impedance. One consequence, for example, is that applicants' device, for certain applications, eliminates the need for the emitter follower configuration using two transistors, without loss of other desirable transistor characteristics.

A further advantage of the structure thus described resides in its vastly decreased base-layer resistance resulting from the use of a thin but highly doped semiconductor zone which functions as a transistor base layer in this device. Accordingly, both the current handling capability and the frequency response is enhanced.

A further advantage of the device in accordance with this invention is its relative ease of fabrication. In particular, inasmuch as only a single junction is required and the disposition of the dielectric film and metal electrodes do not require precise dimensional controls, relatively simple fabrication steps can be used.

Figure 2:
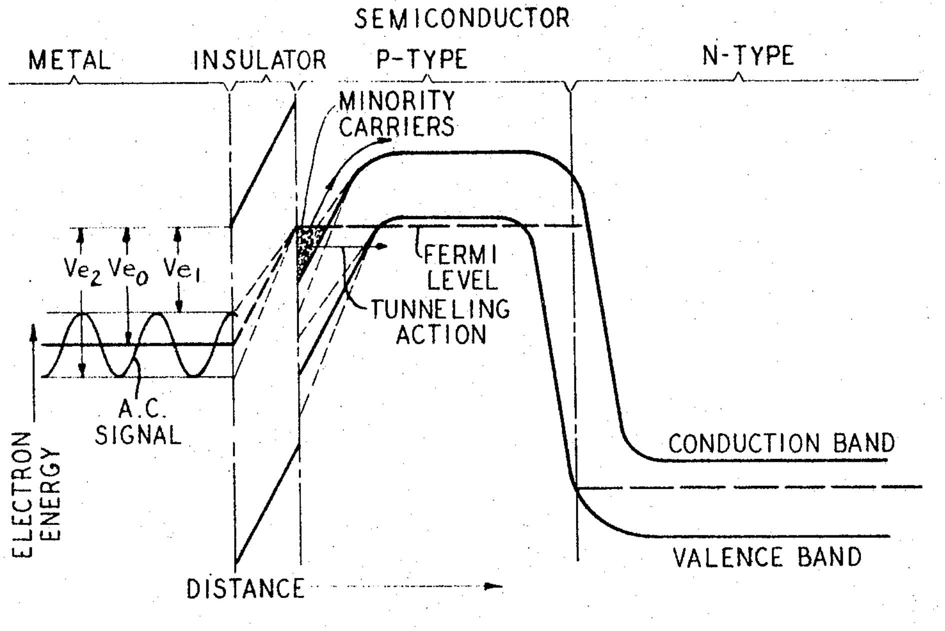

The invention and its other advantages will be more clearly understood from the following detailed description taken in conjunction with the drawing in which:

FIG. 1 shows an embodiment in accordance with the invention in both a cross-sectional view and associated circuit schematic; and FIG. 2 is an energy band diagram depicting the mode of operation of the device in accordance with the invention.

In the arrangement shown in FIG. 1 the solid state element 10 comprises a silicon body 11 having an N type conductivity substrate 12 and a thin P type conductivity zone 13. A metal plated electrode 14 is in low resistance contact with the N type substrate 12 and a metal electrode 15 similarly contacts the P type zone 13. Typically, the silicon semiconductor body is of single crystal material and may comprise a wafer 20 mils square and 2 or 3 mils in total thickness. The P type zone 13, as will be more fully discussed hereinafter, is very thin, in the range of tenths of microns. One mil is equal to 25 microns.

Overlying a portion of the surface of the P type zone 13 is a dielectric film 16 of a material capable of having a suitably high displacement as set forth in the concurrently filed application referred to hereinbefore. In particular, the film 16 is silicon nitride with a thickness of about 1500 angstroms. Overlying at least a portion of the dielectric film 16 is a metal electrode 17 which typically consists of an initial layer of chromium and an overlayer of golf for protection and ease of contacting.

As indicated by the circuit schematic a direct current source 18 and an alternating current signal source 19 are connected across the dielectric film by connections to electrodes 15 and 17. Typically the direct current voltage source 18 may have a value ($V_{e0}$) of about 20 volts and the alternating current signal voltage source 19 a value in excess of about one microvolt, usually in the millivolt range. A second direct current potential 20 is connected between electrodes 14 and 15 so as to bias the PN junction 21 in reverse. The voltage of the source 20 typically may be about 10 volts. Output leads 22 are connected across a suitable load 23 for observing the amplified output from the device.

As suggested hereinbefore, the P type zone 13 is thin and very heavily doped material suitable for quantum-mechanical tunneling. In particular, a doping level in excess of $10^{19}$ impurity atoms per cubic centimeter is provided. This zone is facilely made by a high temperature solid state diffusion process using an impurity such as boron which may be provided by a furnace treatment with the diffusant in gaseous form. This technique is well known in the art and the fabrication of a one-tenth micron thick zone having a substantially uniform concentration in excess of $10^{19}$ atoms per cubic centimeter is not an exceptional process. Fabrication of the silicon nitride film on the surface of the P type zone 13 similarly may be accomplished by techniques referred to in the concurrently filed application of Berglund referred to hereinbefore. Suitable masking techniques are available for limiting the extent of the dielectric film 16 to expose a portion of the surface of the P type zone 13 for making the low resistance electrode 15. Making of the metal electrodes 14, 15 and 17 by deposition technique likewise is well known.

A more detailed explanation of the operation of the apparatus of FIG. 1 is suggested by the enegry band diagram shown therein. This is a conventional diagram of the structure of FIG. 1 showing from left to right the band configuration within the insulator, the P type semiconductor layer and the N type semiconductor layer. Application of the direct current potential, $V_{e0}$, from the source 18 results in a field which bends the energy bands rather steeply at the insulator-semiconductor interface. This combination of impurity concentration and electric field is conducive to quantum-mechanical tunneling of carriers between the valence and the conduction band. Minority carriers provided by such tunneling will diffuse toward the reverse-biased PN junction and will be colected thereat when the thickness of the P type zone is comparable to a minority carrier diffusion length. As set forth above, this dimension typically is about two-tenths micron. Practically, the thin zone may range from one-tenth to one-half micron in thickness.

The alternating current signal input for modulating this tunnel current is shown as a sinusoidal voltage within an envelope defined by the limits $V_{e1}$, and $V_{e2}$, about the direct current bias voltage $V_{e0}$. The effect of this changing voltage is to change the applied field at the insulator-semiconductor interface and consequently change the displacement which is related to the product of the magnitude of the field and the dielectric constant of the insulator. Inasmuch as the density of minority carriers within the semiconductor with applied field likewise is directly related to the displacement, this density varies in response to the input signal. Finally, the number of minority carriers which diffuse in the conduction band across the P type zone and which represent the injection current, are related to the minority carrier density produced within the field in the semiconductor near the insulator-semiconductor interface.

This modulation of minority carrier injection is depicted graphically by the broken line representations of the deflection of the band edges at the insulator-semiconductor interface in FIG. 2. The effect of this movement in the band edges on the minority carrier density at the interface can be appreciated by the change in the conduction band area susceptible to tunneling. This carrier density is reflected in the quantity of carriers diffusing in the conduction band as represented by the arrowed line. The collection of these carriers through the high impedance of the reverse-biased PN junction then results in an output which is an amplified replica of the input signal.

It will be understood that the conductivity types of the zones of the above-described embodiment may be reversed with a corresponding reversal in the polarity of the biases. Moreover, other materials may be employed as suggested in the application of Berglund referred to hereinbefore.

Moreover, other structures and specific biasing arrangements may be employed. In particular, the dielectric film may comprise a very thin layer with a very high dielectric constant wherein sufficient built-in field may be provided to enable minority carrier injection. Also, the device may be operated with the PN junction in the forward-biased condition achieving modulation of the forward characteristic with the same advantageous characteristics of the device arrangement described hereinbefore.

For example, materials other than those specifically disclosed may be used. In addition to silicon semiconductor material, germanium and intermetallic semiconductor compounds of the III–V and II–V groupings may be used. Other dielectrics besides silicon nitride, such as silicon oxide, tantalum oxide and aluminum oxide may be used. Moreover, planar techniques may be used to fabricate the single PN junction with the junction boundaries intersecting the active surface. However, in all arrangements the major plane surface of the PN junction is parallel to the dielectric-semiconductor interface.

Accordingly, although the invention has been described in terms of certain specific embodiments it will be understood that other arrangements may be devised by those skilled in the art which likewise fall within the scope and spirit of the invention.

What is claimed is:

1. A semiconductor signal translating device comprising a body of semiconductor material, a dielectric film on at least a portion of a surface of said body said film having a thickness of about 1500 angstroms, a first zone of said body adjoining said dielectric film being of one conductivity type and having an impurity concentration sufficiently high to enable tunneling, said zone having a depth from said surface of about a carrier diffusion length, a second zone in said body of opposite conductivity type defining with said first zone a PN junction, the plane of said PN junction being disposed substantially parallel to the plane of said surface and there being no other PN junction in said body an electrode overlying said dielectric film, and a separate low resistance connection to each of said two zones.

2. A semiconductor signal translating device in accordance with claim 1 in which said semiconductor material is one selected from the group consisting of silicon germanium and intermetallic semiconductor compounds of the III–V and II-VI combinations.

3. A semiconductor signal translating device in accordance with claim 1 in which said dielectric film is one selected from the group consisting of silicon nitride, silicon oxide, tantalum oxide and aluminum oxide.

4. Apparatus comprising a device in accordance with claim 1 in combination with the following: first means and signal means connected between said electrode and said first zone, said first means for producing an electric field at the dielectric-semiconductor interface of sufficient magnitude to enable minority carrier injection into the adjoining portion of the first zone, said signal means for modulating said minority carrier injection, and second means connected between said first and second zones adapted to enable collection of the injected carriers by said PN junction.

5. Apparatus in accordance with claim 4 in which said first means comprises a direct current voltage, and said second means comprises a direct current voltage for biasing the PN junction in reverse.

6. Apparatus in accordance with claim 5 in which said signal voltage means comprises an alternating current voltage.

7. Apparatus in accordance with claim 6 in which said first zone is of P type conductivity and said second zone is of N type and said first voltage means is about 20 volts, said second voltage means is about 10 volts, and the signal voltage means is of the order of one millivolt.

References Cited

UNITED STATES PATENTS 3,309,586 3/1967 Kleinknecht ---------- 317—235

OTHER REFERENCES

IBM Technical Disclosure Bulletin, vol. 5, No. 10, March 1963—"Thin Film Tunnel Devices" by Magill and Akmenkalns—p. 126.

NATHAN KAUFMAN, Primary Examiner

U.S. Cl. X.R.

317—234; 330—38